US009121091B2

(12) United States Patent
Everett et al.

(10) Patent No.: US 9,121,091 B2
(45) Date of Patent: Sep. 1, 2015

(54) TURBINE AIRFOIL MASK

(75) Inventors: Robert C. Everett, Burlington, CT (US); Henry H. Thayer, Wethersfield, CT (US)

(73) Assignee: United Technologies Corporation, Hartford, CT (US)

( * ) Notice: Subject to any disclaimer, the term of this patent is extended or adjusted under 35 U.S.C. 154(b) by 774 days.

(21) Appl. No.: 13/353,979

(22) Filed: Jan. 19, 2012

(65) Prior Publication Data
US 2013/0189115 A1 Jul. 25, 2013

(51) Int. Cl.
B05C 21/00 (2006.01)
C23C 14/04 (2006.01)
B05C 17/06 (2006.01)

(52) U.S. Cl.
CPC ............... *C23C 14/042* (2013.01); *B05C 17/06* (2013.01); *B05C 21/005* (2013.01); *Y10T 29/49337* (2015.01)

(58) Field of Classification Search
CPC .... B05C 17/06; B05C 21/005; C23C 14/042; Y10T 29/49337
USPC .................................................. 118/504, 505
See application file for complete search history.

(56) References Cited

U.S. PATENT DOCUMENTS

| 4,951,390 | A * | 8/1990 | Fraser et al. .................. 29/889.1 |
| 5,565,035 | A | 10/1996 | Sylvestro et al. |
| 5,985,122 | A | 11/1999 | Conner |
| 6,109,873 | A | 8/2000 | Brooks et al. |
| 6,224,673 | B1 | 5/2001 | Das et al. |
| 6,247,895 | B1 | 6/2001 | Brooks et al. |
| 6,273,676 | B1 | 8/2001 | Brooks et al. |
| 6,413,584 | B1 | 7/2002 | Wustman et al. |
| 6,579,567 | B1 | 6/2003 | Das et al. |
| 6,706,323 | B2 | 3/2004 | Wheat et al. |
| 6,821,564 | B2 | 11/2004 | Das et al. |
| 7,066,799 | B2 | 6/2006 | Oussaada et al. |
| 7,632,541 | B2 | 12/2009 | Saylor et al. |
| 2006/0239819 | A1 | 10/2006 | Albert et al. |
| 2011/0239934 | A1 | 10/2011 | Soucy et al. |

FOREIGN PATENT DOCUMENTS

EP 0965391 A1 12/1999

OTHER PUBLICATIONS

European Search Report, mailed Apr. 2, 2013.

* cited by examiner

*Primary Examiner* — Laura Edwards
(74) *Attorney, Agent, or Firm* — Kinney & Lange, P.A.

(57) ABSTRACT

A masking system for an airfoil comprises a locator for positioning along the trailing edge of the airfoil, and first and second mask sections. The first mask section has a trailing edge portion with locator pins for cooperating with a positioning tab on the locator to position the first mask section along the trailing edge of the airfoil, and a leading edge portion for extending around the leading edge of the airfoil to locate the first mask section along the convex surface. The second mask section has a retainer portion for cooperating with a retainer process on the first mask section to retain the second mask along the leading edge of the airfoil, and a flange portion for extending between the locator pins to locate the second mask along the concave surface.

13 Claims, 6 Drawing Sheets

TURBINE AIRFOIL MASK

BACKGROUND

This invention relates generally to turbomachinery, and specifically to turbine rotor and stator components. In particular, the invention concerns rotor and stator airfoils for a gas turbine engine.

Gas turbine engines are rotary-type combustion turbine engines built around a power core made up of a compressor, combustor and turbine, arranged in flow series with an upstream inlet and downstream exhaust. The compressor compresses air from the inlet, which is mixed with fuel in the combustor and ignited to generate hot combustion gas. The turbine extracts energy from the expanding combustion gas, and drives the compressor via a common shaft. Energy is delivered in the form of rotational energy in the shaft, reactive thrust from the exhaust, or both.

Gas turbine engines provide efficient, reliable power for a wide range of applications, including aviation and industrial power generation. Smaller-scale engines such as auxiliary power units typically utilize a one-spool design, with co-rotating compressor and turbine sections. Larger-scale jet engines and industrial gas turbines (IGTs) are generally arranged into a number of coaxially nested spools, which operate at different pressures and temperatures, and rotate at different speeds.

The individual compressor and turbine sections in each spool are subdivided into a number of stages, which are formed of alternating rows of rotor blade and stator vane airfoils. The airfoils are shaped to turn, accelerate and compress the working fluid flow, and to generate lift for conversion to rotational energy in the turbine.

Aviation applications include turbojet, turbofan, turboprop and turboshaft engines. In turbojet engines, thrust is generated primarily from the exhaust. Modern fixed-wing aircraft generally employ turbofan and turboprop designs, in which the low pressure spool is coupled to a propulsion fan or propeller. Turboshaft engines are typically used on rotary-wing aircraft, including helicopters.

Turbofan engines are commonly divided into high and low bypass configurations. High bypass turbofans generate thrust primarily from the fan, which drives airflow through a bypass duct oriented around the engine core. This design is common on commercial aircraft and military transports, where noise and fuel efficiency are primary concerns. Low bypass turbofans generate proportionally more thrust from the exhaust flow, providing greater specific thrust for use on high-performance aircraft including supersonic jet fighters. Unducted (open rotor) turbofans and ducted propeller engines are also known, in a variety of counter-rotating and aft-mounted configurations.

Turbofan engine performance depends on precise control of the working fluid flow, including flow across the airfoil tip section. Where flow losses, clearance, temperature and engine efficiency are of concern, abrasive, thermal and erosion-resistant coating systems are often used. Improved masking systems increase coating accuracy and performance, while reducing processing time, reworking, and scrap rates.

SUMMARY

This invention concerns a masking system for an airfoil. The airfoil is defined by convex and concave surfaces, which extend between leading and trailing edges. The masking system includes a locator positioned along the trailing edge of the airfoil, with first and second mask sections conforming to the convex and concave surfaces.

The first mask section includes leading edge and trailing edge portions. The trailing edge portion has locator pins that cooperate with a positioning tab on the locator, in order to position the first mask section along the trailing edge. The leading edge portion extends around the leading edge of the airfoil, in order to locate the first mask section along the convex surface.

The second mask section includes retainer and flange portions. The retainer portion is positioned in cooperation with a retainer tab on the leading edge portion of the first mask section, in order to retain the second mask section along the leading edge of the airfoil. The flange portion extends between the locator pins on the trailing edge portion of the first mask section, in order to locate the second mask section along the concave surface of the airfoil.

DETAILED DESCRIPTION

Figure 1:
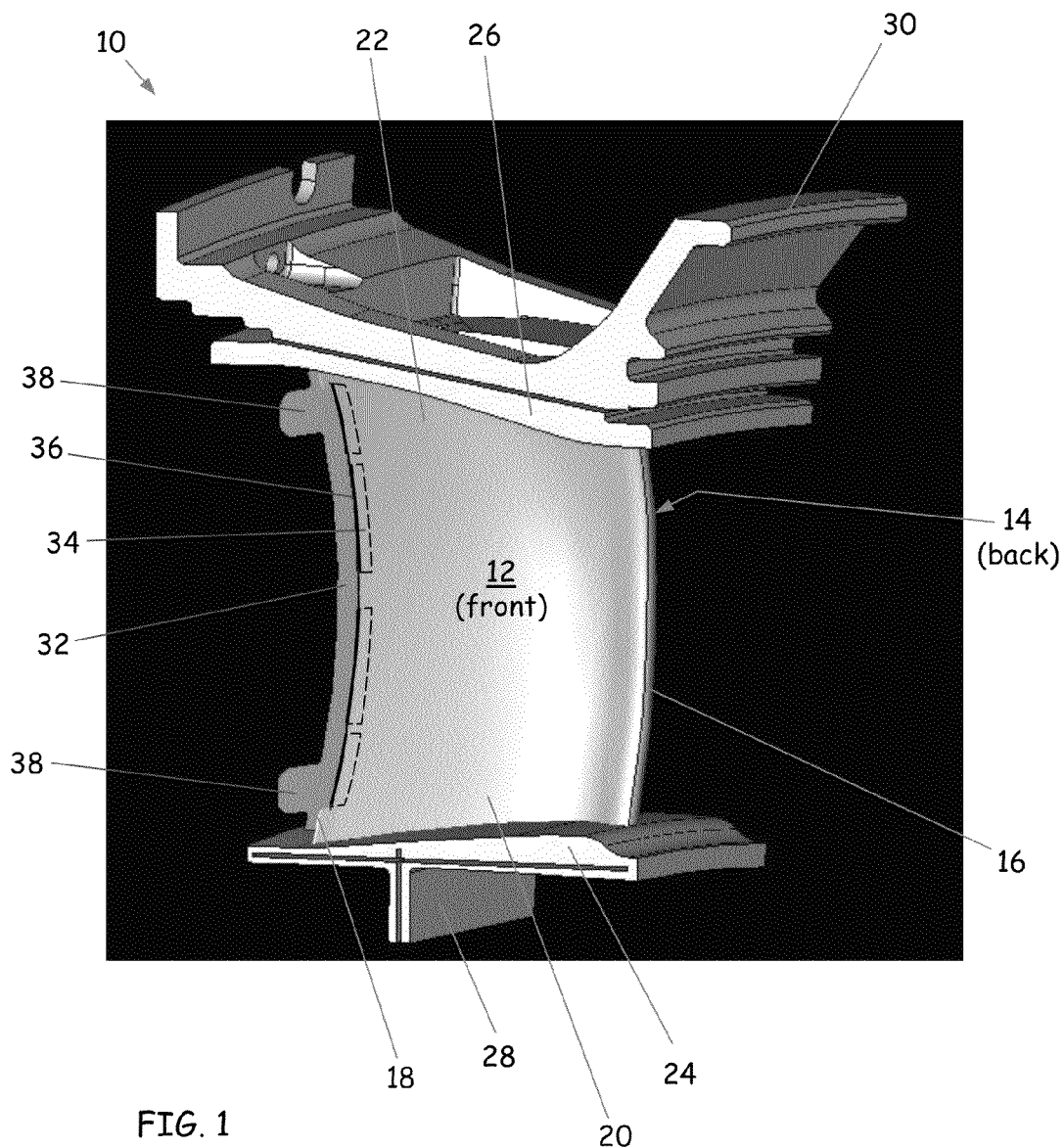
FIG. 1 is a perspective view of an airfoil with a locator for positioning a masking system.

FIG. 1 is a perspective view of airfoil 10. Airfoil 10 is defined between concave or pressure surface 12 (front) and convex or suction surface 14 (back).

Suitable materials for airfoil 10 include composites, metals and metal alloys, including high temperature superalloys. Airfoil 10 extends axially from leading edge 16 to trailing edge 18, and radially from root section 20 to tip section 22.

In the particular example of FIG. 1, airfoil 10 is configured as a vane or stator airfoil with inner diameter (ID) platform 24 adjacent root section 20, and outer diameter (OD) platform 26 adjacent tip section 22. ID and OD platforms 24 and 26 include ID and OD attachments 28 and 30, respectively, for mounting airfoil 10 in a gas turbine engine or other turbomachine, for example in the compressor or turbine section of a turbofan, turboprop, or turboshaft engine. Alternatively, one or both of ID and OD platforms is absent, and airfoil 10 is configured as a cantilevered vane or rotor (blade) airfoil.

Locator 32 is positioned along concave surface 12 of airfoil 10 at trailing edge 18, for example by inserting one or more locator extensions 34 (dashed lines) into one or more cooling holes or cooling slots 36. Alternatively, locator 32 is positioned along convex surface 14 of airfoil 10 at trailing edge 18, with or without locator extensions 34.

Locator 32 includes positioning tabs 38. Positioning tabs (or locator tabs) 38 extend away from trailing edge 18 of airfoil 10 in order to position conforming mask sections along concave surface 12 and convex surface 14, as described below (see FIGS. 2 and 3), for example to mask airfoil 10 during a coating process for one or both of ID platform 24 and OD platform 26.

Figure 2:
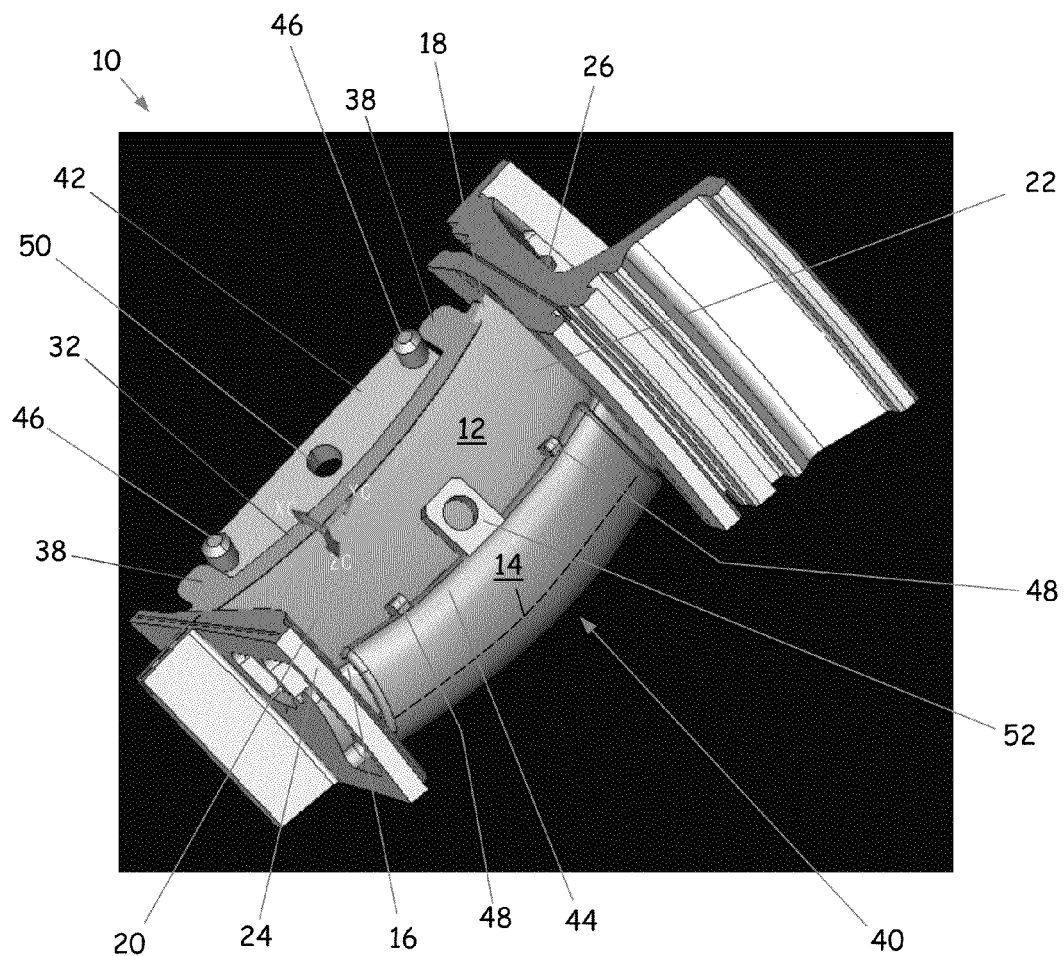
FIG. 2 is a perspective view of the airfoil showing a first mask section positioned along the convex surface of the airfoil.

FIG. 2 is a perspective view of airfoil 10 with first mask section (or first mask) 40 positioned along convex surface 14 (dashed line), opposite concave surface 12. First mask section 40 includes trailing edge portion 42, positioned along trailing edge 18 of airfoil 10, and leading edge portion 44, positioned along leading edge 16 of airfoil 10.

Trailing edge portion 42 of first mask section 40 includes one or more locator pins 46. Locator pins (or processes) 46 extend outward from trailing edge portion 42 of first mask section 40, and are positioned in cooperative engagement with positioning tabs 38 on locator 32 to position first mask section 40 along trailing edge 18 of airfoil 10.

In the particular configuration of FIG. 2, two positioning tabs 38 are spaced along locator 32, extending away from trailing edge 18 of airfoil 10 at root section 20 and tip section 22. Two cooperating locator pins 46 are provided on trailing edge portion 42 of first mask section 40, with locator pins 46 positioned inward of and adjacent to (in contact with) positioning tabs 38. Alternatively, locator 32 includes a single positioning tab 38 in contact with outwardly adjacent locator pins 46 on first mask portion 40, or first mask portion 40 includes a single locator pin 46 in contact with outwardly adjacent positioning tabs 38. In other designs, different numbers of positioning tabs 38 and locator pins 46 are used to cooperatively engage first mask section 40 and locator 32 along trailing edge 18 of airfoil 10.

As shown in FIG. 2, leading edge portion 44 of first (convex) mask section 40 extends around (and in contact with) leading edge 16 of airfoil 10, from convex surface 14 to concave surface 12, in order to position the major surface of first mask section 40 along convex surface 14 of airfoil 10. Alternatively, first mask section 40 is concave, and leading edge portion 44 extends around (and in contact with) leading edge 16 from concave surface 12 to convex surface 14, in order to position the major surface of first mask section 40 along concave surface 12 of airfoil 10.

Leading edge portion 44 of first mask section 40 also includes one or more retainer processes (or retainer tabs) 48, extending away from leading edge 16 of airfoil 10 to retain a second mask section against the opposite (e.g. concave) surface of airfoil 10, as described below. Depending on configuration, one or more cooperating pairs of mechanical fastener holes 50 or fastener tabs 52 (or both) may also be provided along trailing edge portions 42 and 44, as described below.

Figure 3:
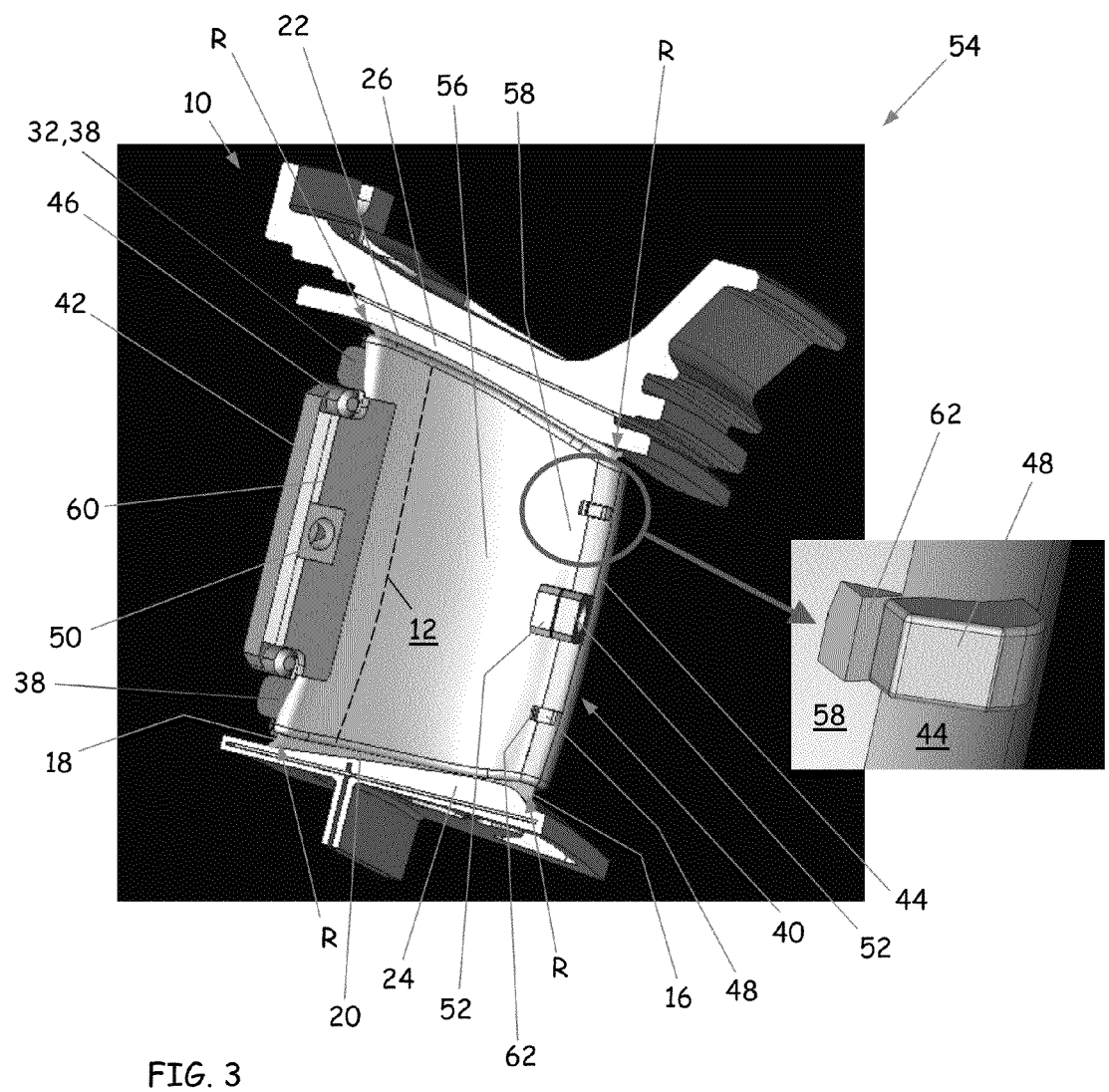
FIG. 3 is a perspective view of the airfoil and masking system, with a second mask section positioned along the concave surface.

FIG. 3 is a perspective view of airfoil masking system 54 with locator 32, first mask section 40 and second mask section 56. Second mask section 56 is positioned along concave surface 12 of airfoil 10 (front surface, dashed line), opposite first mask section 40 on the convex surface of airfoil 10 (back surface).

Suitable materials for locator 32, first mask section 40 and second mask section 56 include composites, metals and metal alloys, similar to the materials of airfoil 10. Alternatively, locator 32, first mask section 40 and second mask section 56 are formed of different materials, for example aluminum, titanium or steel, or an alloy thereof.

Locator 32 includes positioning tab 38 for positioning airfoil masking system 54 along trailing edge 18 of airfoil 10. First mask (or mask section) 40 has trailing edge portion 42 with locator pins 46 for cooperating with positioning tabs 38 to position first mask section 40 along trailing edge 18, and leading edge portion 44 for extending around leading edge 16 from convex surface 14 (back) to concave surface 12 (front), in order to locate first mask section 40 along convex surface 14. Second mask (or mask section) 56 includes retainer portion 58 for cooperating with processes 48 on first mask section 40 to retain second mask section 56 along leading edge 16 of airfoil 10, and flange (or flange portion) 60 for extending between locator pins 46 to locate second mask section 56 along concave surface 12.

As shown in FIG. 3, retainer portion 58 of second mask section 56 is positioned in cooperative engagement with leading edge portion 44 of first mask section 40, along leading edge 16 of airfoil 10. Flange portion 60 is positioned in cooperative engagement with trailing edge portion 42 of first mask section 40, along trailing edge 18 of airfoil 10.

First and second mask sections 40 and 56 are sized to cover substantially all of concave and convex surfaces 12 and 14 of airfoil 10 during a coating process, from leading edge 16 to trailing edge 18, and from root section 20 to tip section 22. Representative coating processes include, but are not limited to, thermal, bond, abrasive and abrasion-resistant coating processes applied to one or both of ID platform 24 and OD platform 26, leaving concave and convex surfaces 12 and 14 uncoated.

Where airfoil 10 has fillets or fillet radii R on root section 20 (adjacent ID platform 24) or tip section 22 (adjacent OD platform 26), mask sections 40 and 56 are sized to extend to fillets R. Mask sections 40 and 56 may further be sized to leave fillets R exposed during the coating process, as shown in FIG. 3, or mask sections 40 and 56 may be sized to cover fillets R on one or both of root section 20 and tip section 22.

As shown in FIG. 3, retainer portion (or retainer) 58 cooperates with at least one retainer process 48 on leading edge portion 44 of first mask section 40, in order to position and retain second mask section 56 along leading edge 16 of airfoil 10. In this particular configuration, retainer portion 58 includes two retainer blocks 62, positioned against (in contact with) two retainer processes 48.

Retainer blocks 62 are positioned under retainer processes 48, with a portion of retainer block 62 located between retainer process 48 and concave surface 12 of airfoil 10. Alternatively, retainer process 48 is positioned under retainer block 62, with a portion of process 48 located between retainer block 62 and convex surface 14. More generally, single or multiple retainer processes 48 and retainer blocks 62 may be provided along either or both of retainer portion 58 and leading edge portion 44, in either relationship, in order to retain second mask section 56 and to hold first and second mask sections 40 and 56 together in cooperative engagement along leading edge 16 of airfoil 10.

Flange portion 60 of second (concave) mask section 56 extends between locator pins 46 on trailing edge portion 42 of first mask section 40, forming a cooperative engagement to position second mask section 56 along trailing edge 18 of airfoil 10. As shown in FIG. 3, the major surface of second mask section 56 extends along and conforms to concave surface 12 of airfoil 10. The major surface of first mask section 40 extends along and conforms to convex surface 14.

Alternatively, second mask section 56 is convex, with a major surface conforming to and extending along convex surface 14 of airfoil 10. In this configuration, first mask section 40 is concave, with a major surface extending along and conforming to concave surface 12. Thus, the convex and concave configurations of first and second mask sections 40 and 56 may be interchanged, without departing from the spirit and scope of the design.

Equivalently, one or more individual elements of masking system 54 may be exchanged between mask sections 40 and 56, for example trailing edge portion 42 of first mask section 40 and flange portion 60 of second mask section 56, or retainer portion 58 of second mask section 56 and leading edge portion 44 of first mask section 40. Alternatively, locator pins 46 may be provided on flange portion 60 of first mask section 40, or retainer processes 48 and retainer blocks 62 may be exchanged along leading edge portion 44 of first mask section 40 and retainer portion 58 of second mask section 56. Additional cooperating mechanical fastener holes 50 or fastener tabs 52 may also be provided, in order to attach first and second mask sections 40 and 56 along leading edge 16 and trailing edge 18 of airfoil 10.

Figure 4:
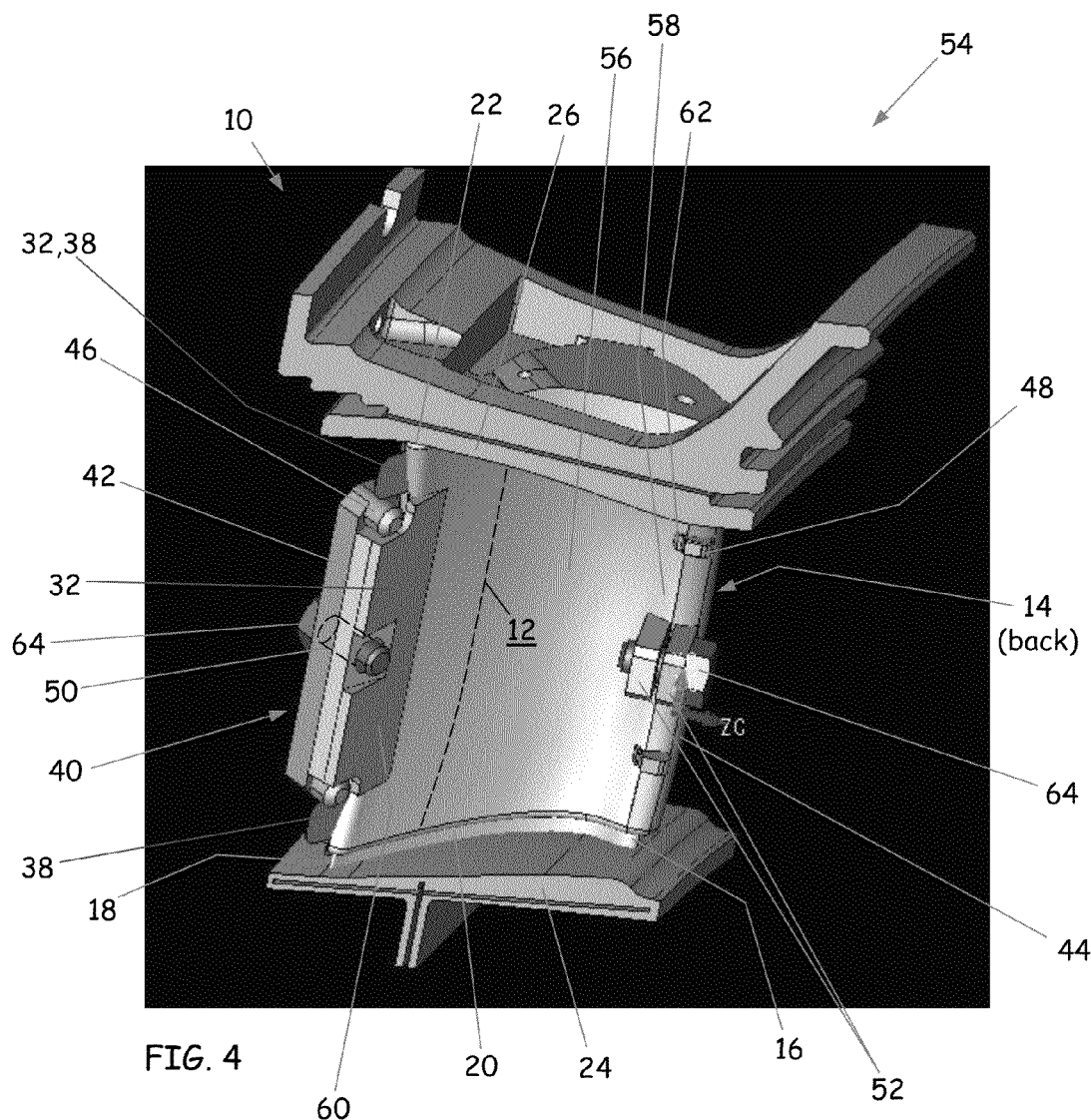
FIG. 4 is a perspective view of the airfoil and masking system, showing mechanical attachments for the mask sections along the leading and trailing edges of the airfoil.

FIG. 4 is a perspective view of airfoil masking system 54, with mechanical fasteners 64. In this particular configuration, masking system (or masking apparatus) 54 includes airfoil 10, locator 32, first (convex) mask section 40 and second (concave) mask section 56. Alternatively, masking system 54 includes locator 32 with first and second mask sections 40 and 56, independent of airfoil 10.

Airfoil 10 has leading edge 16 (right) and trailing edge 18 (left), with concave (pressure) and convex (suction) surfaces 12 and 14 extending therebetween. Concave and convex surfaces 12 and 14 extend axially between leading and trailing edges 16 and 18, and radially from root section 20 of airfoil 10, adjacent ID platform 24, to tip section 22 of airfoil 10, adjacent OD platform 26.

Locator 32 is positioned along trailing edge 18 of airfoil 10. Positioning tabs 38 are spaced along locator 32 between root section 20 and tip section 22 of airfoil 10, extending away from trailing edge 18.

First (convex) mask section 40 conforms to convex surface 14 (back) of airfoil 10. Trailing edge portion 42 has locator pins 46 in cooperative engagement with positioning tabs 38, in order to position first mask section 40 along trailing edge 18. Leading edge portion 44 extends around leading edge 16 of airfoil 10 from convex surface 14 (back) to concave surface 12 (front), positioning first mask section 40 along convex surface 14. Retainer processes 48 extend away from leading edge 16 and concave surface 12 of airfoil 10, out of the plane of the picture in FIG. 4.

Second (concave) mask section 56 conforms to concave surface 12 (front) of airfoil 10. Retainer portion 58 has retainer blocks 62 in cooperative engagement with retainer processes 48, in order to position and retain second mask section 56 along leading edge 16 of airfoil 10. Flange portion 60 extends between locator pins 46 along trailing edge 18, positioning second mask section 56 along concave surface 12.

Mechanical fasteners 64, for example bolts, screws or pins, extend through cooperating fastener holes 50 or fastener tabs 52 (or both) to fasten first and second mask sections 40 and 56 together along trailing edge portion 42 and leading edge portion 44. In the particular configuration of FIG. 4, for example, a first mechanical fastener 64 is located in cooperating fastener holes 50 extending through trailing edge portion 42 and flange portion 60, and a second mechanical fastener 64 is located in cooperating holes extending through fastener tabs 52 along leading edge portion 44 and retainer portion 58.

Figure 5:
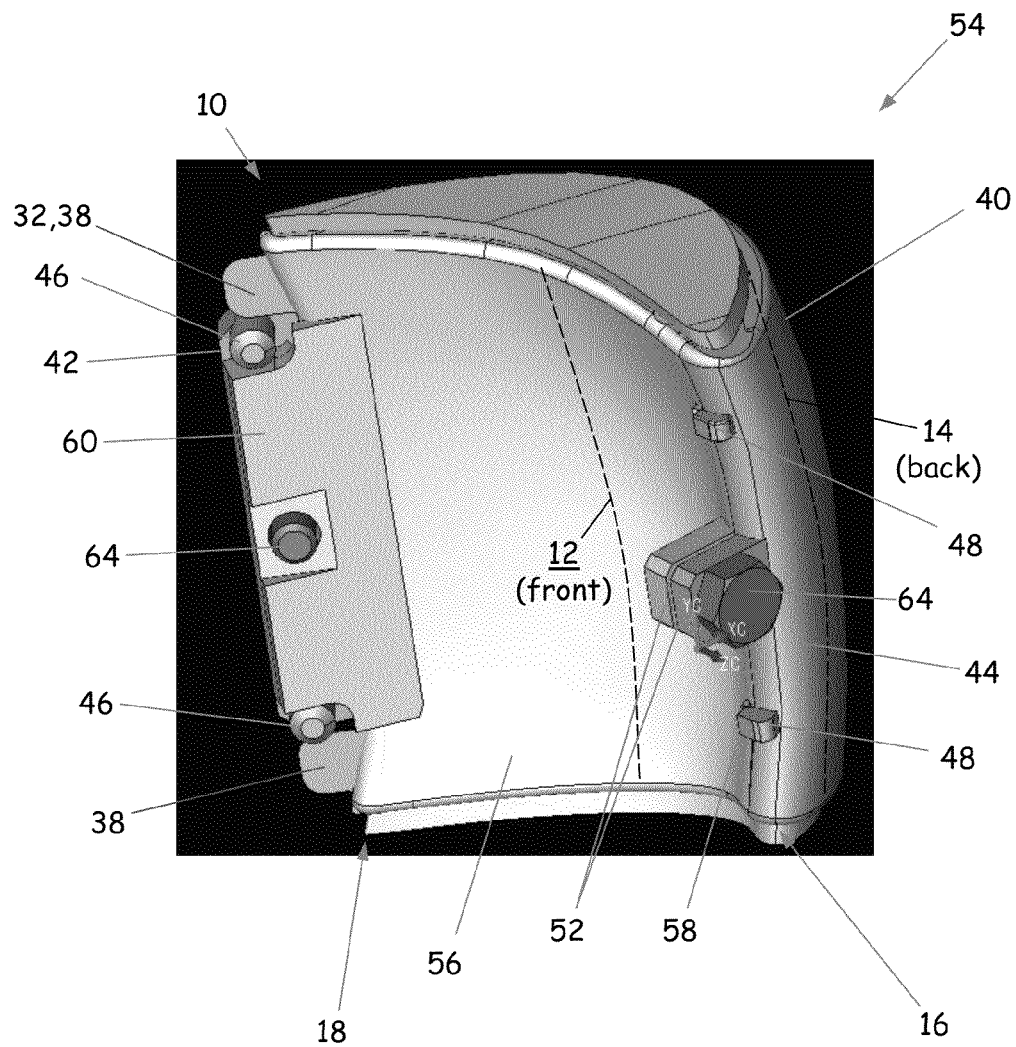
FIG. 5 is a perspective view of the airfoil and masking system, with the airfoil platforms removed.

FIG. 5 is a perspective view of airfoil masking system 54 for airfoil 10. Masking system (mask or mask assembly) 54 includes locator 32 with first and second mask sections 40 and 56, as described above. In this configuration, airfoil 10 is shown without the ID and OD platforms, and is configured for use as a rotor blade or stator vane for the compressor or turbine section of a gas turbine engine or other turbomachine.

Locator 32 is positioned along trailing edge 18 of airfoil 10. Positioning tabs 38 are used to position first and second mask sections 40 and 56 with major surfaces conforming to concave surface 12 (front) and convex surface 14 (back), respectively.

Trailing edge portion 42 of first mask section 40 includes first and second locator pins 46 in cooperative engagement with first and second positioning tabs 38 on locator 32, in order to position first mask section 40 along trailing edge of airfoil 10. Leading edge portion 44 extends around leading edge 16 of airfoil 10 to position first (convex) mask section 40 along convex surface 14, with first and second retainer processes 48 extending away from leading edge 16 and concave surface 12.

Retainer portion 58 of second mask section 56 engages with first and second retainer processes 48 to retain second mask section 56 along leading edge 16 of airfoil 10. Flange portion 60 extends between first and second locator pins 46 to position second (concave) mask section 56 along concave surface 12 of airfoil 10. Mechanical fasteners 64 extend through fastener tabs 52 and cooperating holes in trailing edge portion 42 and flange portion 60, in order to mechanically fasten first and second mask sections 40 and 56 along leading edge 16 and trailing edge 18 of airfoil 10.

Figure 6:
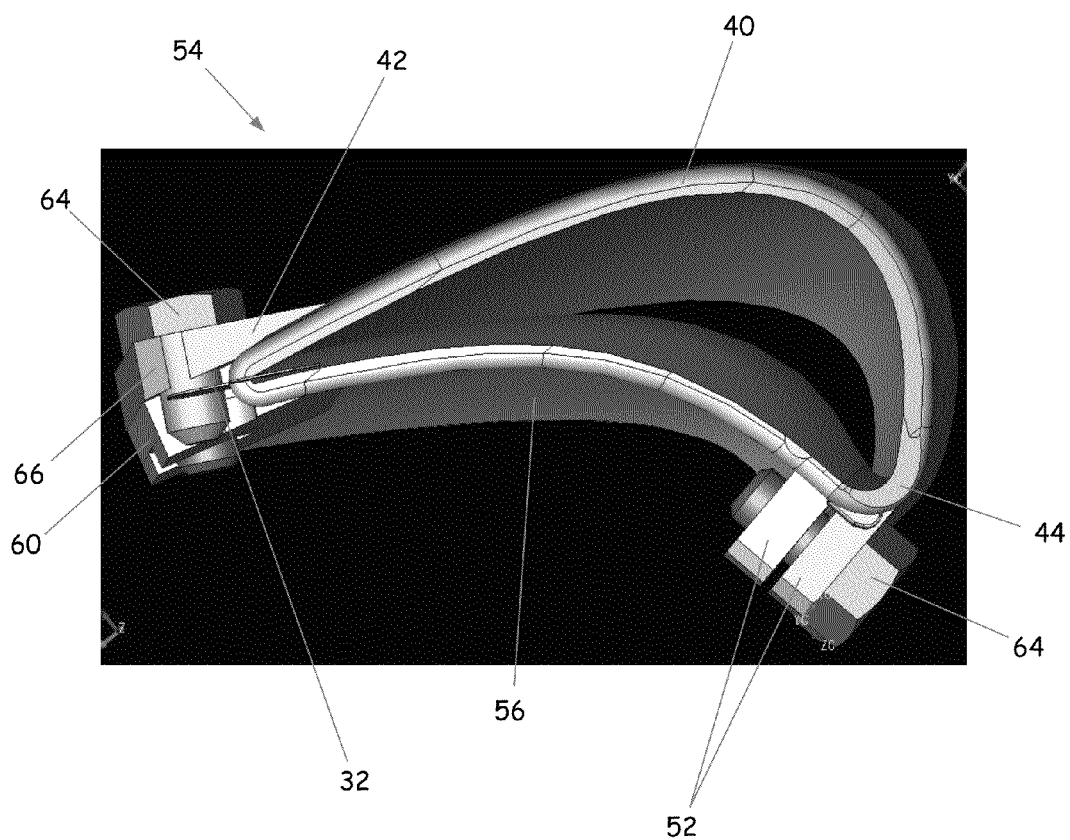
FIG. 6 is an end view of the masking system, without the airfoil.

FIG. 6 is an end view of masking system 54, in a configuration with locator 32, without airfoil 10. As shown in FIG. 6, the profiles of first and second mask sections 40 and 56 are adaptable to conform to a range of different convex and concave surface geometries, including different pressure and suction surfaces for rotor blade and stator vane airfoils in the compressor and turbine sections of a gas turbine engine.

FIG. 6 also shows the close mechanical cooperation provided by masking system 54, with substantially continuous contact between first and second mask sections 40 and 56 along leading edge portion 44, and against locator 32 on either side of trailing edge portion 42 and flange portion 60.

In some designs, fastener tabs 52 are provided in a spaced or biasing arrangement so that mechanical fastener 64 can be tightened to bias first mask section 40 against second mask section 56, for example along leading edge portion 44, as shown in FIG. 6, or along trailing edge portion 42. Alternatively, mechanical fasteners 64 are provided in a direct contact or compressive relationship, for example extending through cooperating fastener holes in flange portions 60 and 66 of first and second mask sections 40 and 56. In this configuration, mechanical fastener 64 can be tightened to compress locator 32 in a direct contact relationship between first and second mask sections 40 and 56, for example along trailing edge portion 42, as shown in FIG. 6, or along leading edge portion 44.

While this invention has been described with reference to exemplary embodiments, it will be understood by those skilled in the art that various changes may be made and equivalents may be substituted for elements thereof without departing from the spirit and scope of the invention. In addition, modifications may be made to adapt a particular situation or material to the teachings of the invention, without departing from the essential scope thereof. Therefore, the invention is not limited to the particular embodiments disclosed herein, but includes all embodiments falling within the scope of the appended claims.

The invention claimed is:

1. A masking system for masking an airfoil during a coating process, the airfoil having a leading edge, a trailing edge and convex and concave surfaces extending therebetween, the masking system comprising:
   a locator for positioning the masking system along the trailing edge of the airfoil, the locator having a positioning tab;

a first mask contoured to conform to the convex surface of the airfoil, the first mask comprising:
  a trailing edge portion having locator pins for cooperating with the positioning tab to position the first mask along the trailing edge of the airfoil; and
  a leading edge portion for extending around the leading edge of the airfoil from the convex surface to the concave surface to locate the first mask along the convex surface of the airfoil, the leading edge portion having a retainer tab extending away from the leading edge; and
a second mask contoured to conform to the concave surface of the airfoil, the second mask comprising:
  a retainer portion for cooperating with the retainer tab to retain the second mask along the leading edge of the airfoil; and
  a flange portion for extending between the locator pins to locate the second mask along the concave surface of the airfoil.

2. The masking system of claim 1, wherein the locator comprises first and second positioning tabs and the trailing edge portion of the first mask comprises first and second locator pins for cooperating with the first and second positioning tabs.

3. The masking system of claim 1, wherein the leading edge portion of the first mask comprises first and second retainer tabs and the retainer portion of the second mask comprises first and second retainer blocks for cooperating with the first and second retainer tabs.

4. The masking system of claim 1, wherein the trailing edge portion of the first mask and the flange portion of the second mask have cooperating fastener holes.

5. The masking system of claim 4, wherein the leading edge portion of the first mask and the retainer portion of the second mask have cooperating fastener tabs.

6. The masking system of claim 5, further comprising mechanical fasteners located in the cooperating fastener holes and the cooperating fastener tabs to fasten the first and second masks together along the leading edge and trailing edge portions of the first mask.

7. The masking system of claim 1, wherein the locator comprises an extension for positioning the locator by sliding the extension into a cooling hole along the trailing edge of the airfoil.

8. The masking system of claim 1, wherein the first and second masks are sized to extend to a fillet on the root section or tip section of the airfoil, leaving the fillet exposed.

9. The masking apparatus of claim 8, wherein the locator comprises an extension positioned in a cooling hole or cooling slot along the trailing edge of the airfoil.

10. The masking apparatus of claim 9, further comprising a mechanical fastener extending through cooperating holes located in the trailing edge portion of the convex mask section and the flange.

11. A masking apparatus for masking an airfoil during a coating process, the airfoil having a leading edge, a trailing edge and pressure and suction surfaces extending therebetween, the masking apparatus comprising:
  a locator positioned along the trailing edge of the airfoil, the locator having a positioning tab extending away from the trailing edge;
  a convex mask section conforming to the suction surface of the airfoil, the convex mask section comprising:
    a trailing edge portion having locator pins in cooperative engagement with the positioning tab along the trailing edge of the airfoil; and
    a leading edge portion extending around the leading edge of the airfoil from the convex surface to the concave surface, the leading edge portion having a retainer tab extending away from the leading edge; and
  a concave mask section conforming to the pressure surface of the airfoil, the concave mask section comprising:
    a retainer block in cooperative engagement with the retainer tab along the leading edge of the airfoil; and
    a flange extending between the locator pins along the trailing edge of the airfoil.

12. The masking apparatus of claim 11, further comprising a mechanical fastener extending through cooperating fastener tabs extending from the convex and concave mask sections along the leading edge of the airfoil.

13. The masking apparatus of claim 12, wherein the convex and concave mask sections extend to a fillet on the root section or tip section of the airfoil, leaving the fillet exposed.

* * * * *